United States Patent
Lamant

(10) Patent No.: US 9,208,277 B1
(45) Date of Patent: Dec. 8, 2015

(54) AUTOMATED ADJUSTMENT OF WIRE CONNECTIONS IN COMPUTER-ASSISTED DESIGN OF CIRCUITS

(75) Inventor: Gilles S. C. Lamant, Sunnyvale, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 421 days.

(21) Appl. No.: 13/214,119

(22) Filed: Aug. 19, 2011

(51) Int. Cl.
G06F 17/50 (2006.01)

(52) U.S. Cl.
CPC ........ *G06F 17/5072* (2013.01); *G06F 17/5068* (2013.01); *G06F 17/5081* (2013.01)

(58) Field of Classification Search
None
See application file for complete search history.

(56) References Cited

U.S. PATENT DOCUMENTS

| | | | | |
|---|---|---|---|---|
| 3,654,615 A * | 4/1972 | Freitag | | 716/122 |
| 3,681,782 A * | 8/1972 | Scanlon | | 700/56 |
| 4,593,363 A * | 6/1986 | Burstein et al. | | 716/122 |
| 4,630,219 A * | 12/1986 | DiGiacomo et al. | | 716/123 |
| 4,888,665 A * | 12/1989 | Smith | | 361/780 |
| 5,581,475 A * | 12/1996 | Majors | | 716/112 |
| 5,666,288 A * | 9/1997 | Jones et al. | | 716/55 |
| 5,737,580 A * | 4/1998 | Hathaway et al. | | 716/115 |
| 6,002,857 A * | 12/1999 | Ramachandran | | 716/122 |
| 6,038,383 A * | 3/2000 | Young et al. | | 716/113 |
| 6,308,303 B1 * | 10/2001 | Mysore et al. | | 716/115 |
| 6,378,110 B1 * | 4/2002 | Ho | | 716/112 |
| 6,904,584 B2 * | 6/2005 | Brenner et al. | | 716/122 |
| 7,039,890 B2 * | 5/2006 | Takechi et al. | | 716/113 |
| 7,325,210 B2 * | 1/2008 | Rao et al. | | 716/113 |
| 7,603,641 B2 * | 10/2009 | Lin | | 716/120 |
| 7,669,161 B2 * | 2/2010 | Lin | | 716/55 |
| 7,685,553 B2 * | 3/2010 | Papadopoulou et al. | | 716/129 |
| 7,784,010 B1 * | 8/2010 | Balsdon et al. | | 716/118 |
| 7,908,573 B2 * | 3/2011 | Lin | | 716/54 |
| 8,429,584 B2 * | 4/2013 | Keinert et al. | | 716/113 |
| 8,458,641 B2 * | 6/2013 | Tang et al. | | 716/132 |
| 2003/0177464 A1* | 9/2003 | Takechi et al. | | 716/10 |
| 2006/0030138 A1* | 2/2006 | Konishi | | 438/599 |
| 2006/0080630 A1* | 4/2006 | Lin | | 716/11 |
| 2006/0206845 A1* | 9/2006 | Rao et al. | | 716/6 |
| 2008/0320428 A1* | 12/2008 | Lin | | 716/10 |
| 2011/0246959 A1* | 10/2011 | Tang et al. | | 716/127 |

* cited by examiner

*Primary Examiner* — A. M. Thompson
(74) *Attorney, Agent, or Firm* — Sawyer Law Group, P.C.

(57) ABSTRACT

In one aspect, a method for providing a circuit design includes defining an interconnect network comprising a plurality of wire connections, the defining performed after modification of the interconnect network and before completion of the interconnect network. An adjustment technique is applied to the wire connections of the defined interconnect network before completion of the interconnect network.

19 Claims, 16 Drawing Sheets

AUTOMATED ADJUSTMENT OF WIRE CONNECTIONS IN COMPUTER-ASSISTED DESIGN OF CIRCUITS

FIELD OF THE INVENTION

The present invention relates to graphical circuit design using computer systems, and more particularly to computer-assisted design of circuits.

BACKGROUND OF THE INVENTION

Computer-enabled graphical display and editing systems are used in a wide variety of different applications and industries to create, view and edit different types of visual images on computer systems or other electronic devices. One common application is electronic design automation, including such applications as layout design, in which the designs for components and spatial layout of electronic components such as integrated circuits, circuit boards, and other components are created, viewed, and edited using displayed images and graphical controls in graphical software applications implemented by computer systems. Such circuit design includes the physical layout of components of the design as well as the electrical interconnects, such as wires or traces, between components. Some embodiments of circuit layout applications provide automation in various aspects or stages of the design, including the design of conductive connections such as wire connections that connect components. As the need for automation and assistance continues to increase in the custom layout space, the use of automation for the implementation of wiring in designs is gaining acceptance.

In designs for integrated circuits or other circuits, a conductor such as metal is used to connect components of the design. Electrical current passes through the metal interconnects and this conduction causes certain effects that must be taken into account in the circuit design. One of these effects is known as "IR drop", which is a decrease in voltage along a wire due to the resistance (or sheet resistance) of the metal of the wire, and which may affect the ability of the circuit to function. Another one of these effects is electromigration, in which the force of moving electrons can over time knock a number of atoms from their original positions, eventually causing gaps in the metal and in the connections that prevent electricity flow, or causing build up of material and short circuits to nearby wires. One way to address these effects is to increase the width of a wire and thus reduce the resistivity. In addition, vias and other layer-to-layer connections are vulnerable to wire effects and can be arranged in particular orientations and modified (e.g. increased) in number to distribute current evenly through the vias and reduce these effects. Widening wires and adjusting via configuration, however, has limitations due to the restricted physical space available for such connections.

There are tools and methods to compute these wire effects on a circuit in a design. Automation can help a designer take into account and mitigate the above-described effects of metal wires by automatically checking the proper widths for the wires in a circuit. However, a problem with previous automatic wiring effect feedback is that it is performed after the circuit has been completed in the design application. For example, wiring is often created manually by a designer, where the designer knows all the currents in the circuit and other necessary information to manually compute the widths of wires. The user draws a wire trunk in the graphical application, and then creates smaller distribution networks connected to the trunk and having widths also manually computed. Since this is tedious, a designer may often take shortcuts and over-budget, e.g., use wider wires than is necessary. A wiring automation tool is used to verify that the wiring network has sufficient dimensions to avoid undesired wire effects, where this tool can provide feedback to the user as to which wires have potential problems with IR drop and electromigration. The tool provides this feedback typically after the wiring network is completed. In more recent tools, interactive feedback can be provided related to electromigration as the user draws interconnects in the design. In any case, wires that are indicated to have such wire effect problems must be manually changed by the designer based on the feedback obtained from the wiring automation tool, such as by moving the wires and/or changing the metal used in wires to provide different properties.

In other previous implementations, greater automation has been used. Full automation in generating a circuit topology has not yet been successful in meeting the requirements of high accuracy analog circuitry and the expectations of an expert layout engineer. However, other methods have been used for sizing the features of a topology. For example, a designer can manually create and complete a circuit topology, and then a sizing engine tool can be applied to automatically generate optimal sizes and widths for each wire segment in the user-specified topology based on the current computed for each wire branch. However, the designer does not know the final widths of the wires while creating the circuit design, and therefore cannot as easily make topological decisions and trade-offs as to where to place the wiring. Thus, if IR drop, electromigration, or available area is found to be an issue not easily resolved by the sizing engine, the designer must go back and re-design portions of the circuit, leading to greater inefficiency.

SUMMARY OF THE INVENTION

The embodiments of the present application relate to adjustment techniques in computer-assisted design of circuits. In one aspect, a method for providing a circuit design includes defining an interconnect network comprising a plurality of wire connections, the defining performed after modification of the interconnect network and before completion of the interconnect network. An adjustment technique is applied to the wire connections of the defined interconnect network before completion of the interconnect network. In some embodiments, the wire connections include wire segments and vias. A similar aspect is provided for a computer program product comprising a computer readable medium including program instructions for implementing similar features, and for a system providing similar features.

In another aspect, a system for providing a circuit design includes a memory and a processor, where the processor causes a display of the circuit design on a display device connected to the processor, and receives modifications to at least one wire segment or via in the circuit design. After each of the modifications, an interconnect network is defined comprising wire segments and vias including the modified at least one wire segment or via, and an adjustment technique is applied to the plurality of wire segments and vias of the defined interconnect network.

The present embodiments allow a user to work within a graphical interface and image to update a design such as an interconnect network assisted by various described features set forth by way of example and not limitation, such as automatic adjustment of an interconnect network allowing incremental evaluation and greater design efficiency.

DETAILED DESCRIPTION

Figure 1:
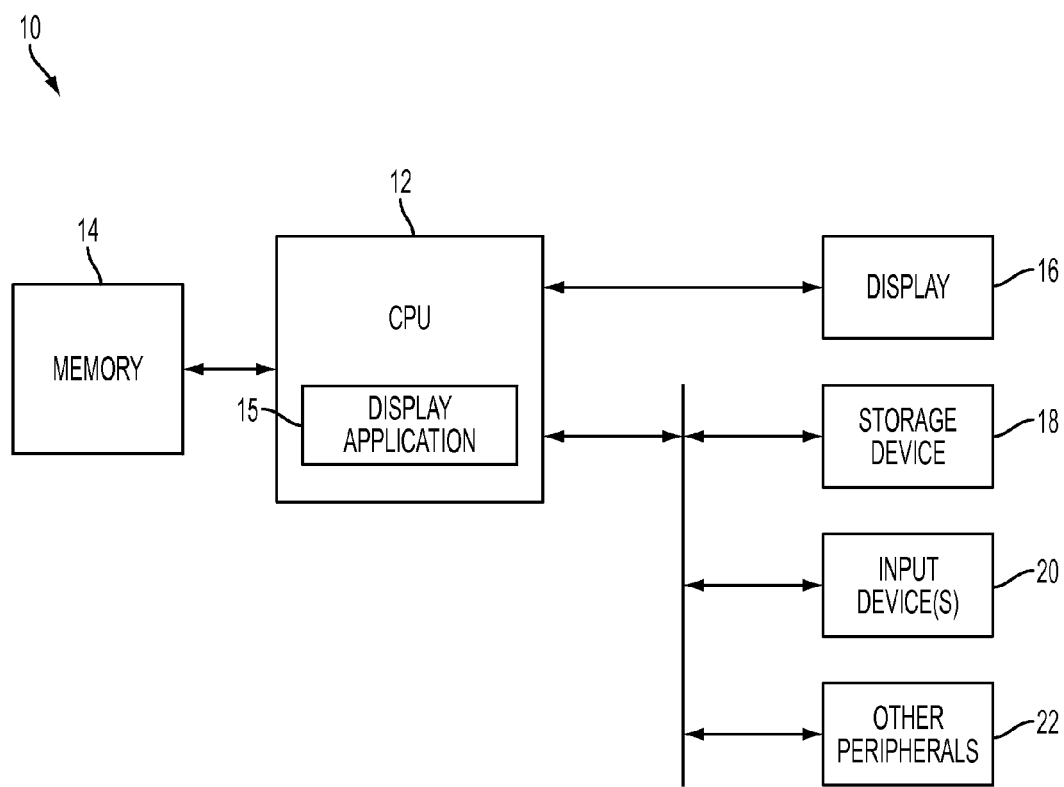
FIG. 1 is a block diagram illustrating a system suitable for use with the present invention.

The present embodiments relate to graphical circuit design using computer systems, and more particularly to computer-assisted design of circuits. The following description is presented to enable one of ordinary skill in the art to make and use the embodiments and is provided in the context of a patent application and its requirements. Various modifications to the preferred embodiments and the generic principles and features described herein will be readily apparent to those skilled in the art. Thus, the present embodiments are not intended to be limited to the examples and features particularly shown but are to be accorded the widest scope consistent with the principles and features described herein.

The present embodiments is mainly described in terms of particular methods and systems provided in particular implementations. However, one of ordinary skill in the art will readily recognize that these methods and systems will operate effectively in other implementations. For example, the system implementations usable with the present embodiments can take a number of different forms. The present embodiments will also be described in the context of particular methods having certain steps. However, the method and system operate effectively for other methods having different and/or additional steps not inconsistent with the present embodiments.

The embodiments herein can take the form of a software embodiment, a hardware embodiment, or an embodiment containing both hardware and software elements. A software embodiment can include but is not limited to firmware, resident software, microcode, etc. Furthermore, some embodiments can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk read only memory (CD-ROM), compact disk read/write (CD-R/W) and DVD.

The present embodiments assist creation of electrical connections in circuit layout designs and similar designs by providing automatic adjustment of the interconnect network after modification to and before completion of the interconnect network, promoting greater efficiency and productivity. The embodiments allow a user to avoid having to make complex wire effect calculations during design. Furthermore, the embodiments allow a user view the required connection size as they are creating the design, allowing incremental evaluation and decisions to be efficiently made during the design process, and avoiding costly post-design evaluation and correction.

To more particularly describe the features of the present invention, please refer to FIGS. 1-19 in conjunction with the discussion below.

FIG. 1 is a block diagram illustrating a system 10 suitable for use with the present invention. System 10 can be any suitable computer system, server, or other electronic or hardware device. For example, the system 10 can be a mainframe computer, desktop computer, workstation, portable computer, or electronic device (set-top box, portable device, cell phone, personal digital assistant, media player, game device, etc.). System 10 includes a CPU 12, memory 14, display device 16, storage device 20, input device(s) 22, and other peripherals 24.

CPU 12 can be one or more processors or processing circuits to execute program code and control basic operations of the system 10, including processing operations, manipulating data, issuing commands to other components of the system 10, etc. For example, an operating system can run on the system 10 and is implemented by the CPU 12 and other components of the system 10. CPU 12 can also implement graphical editing software 15 of the present invention, as described further below.

Memory 14 is typically provided in system 10 for access by the CPU 12, and can include one or more of a variety of types, such as random access memory (RAM), read-only memory (ROM), Electrical Erasable Read-only Memory (EEPROM), Flash memory, etc.

Display device 16 outputs displayed images to a user of the system 10. Display device 16 can be any of a variety of types of displays, including LCD, Plasma, CRT, etc. Some implementations of the display device 16 include a screen having a screen size, e.g., an area within which images are displayed. In some embodiments, the CPU 12, and/or a different processor in communication with the display device, can cause the display of images on the display device by providing the appropriate signals to well-known components of system 10 used in displaying images on device 16. Storage device 18 can store data that may be retrieved by the CPU (including program instructions and/or data for graphical editing software 15), and can be any of a variety of devices such as a hard disk, CD-ROM, DVD-ROM, Blu-Ray disc, magnetic tape, etc. Input devices 20 can include any of a variety of devices that allow users to input commands and data to the CPU, including a keyboard, mouse, trackball, stylus, touchscreen, microphone/voice recognition device, motion sensors, other electronic device (such as another computer system or portable electronic device), or other input device. Other peripherals 22 can include any other devices connected to and used by the system 10, such as any peripheral, card, or interface device that performs one or more functions and communicates with the system 10, such as network adapters that enable the system 10 to become coupled to other computer systems or devices through intervening private or public networks, scanners, printers, sensors, speakers, etc. In the example of FIG. 1, the display device 16 is connected to the CPU 12 by its own dedicated bus, while storage device 18, input devices 20, and other peripherals 22 are connected to a common bus that is also connected to the CPU. In other embodiments, the display device 16 and other devices can each have their own bus, or share one or more common buses. One or more of the buses or other links can be implemented using wires or wirelessly, according to any of well known standards and protocols.

The graphical editing application 15 and interface of the present inventions can be implemented at least in part by the CPU 12 (and/or other processor(s) of system 10) to allow the creation and editing of circuit designs as described herein. The application 15 can cause the display of one or more images and/or interface on the display device 16 and receive input from one or more of the input devices 20 to control the functions of the application and interface. The software 15 can also be stored on storage device 18 and/or in memory 14. Some of the functionality of software 15 is described in greater detail below.

Figure 2:
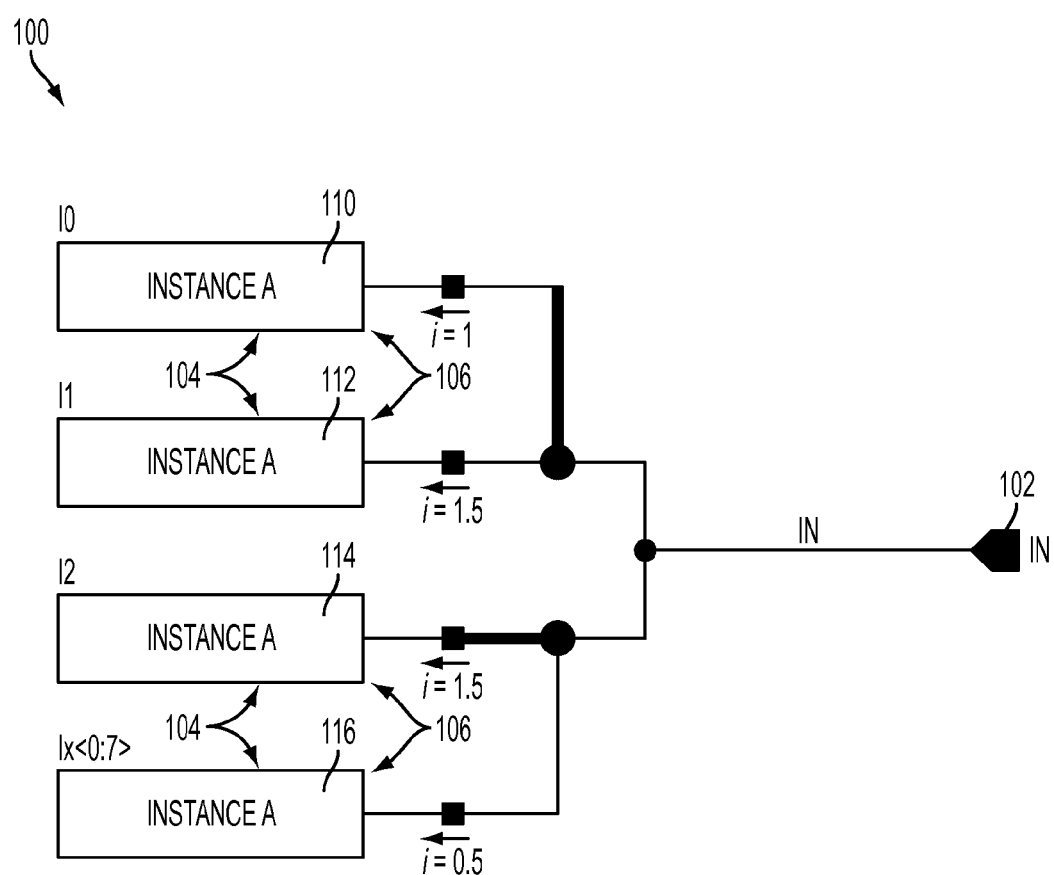
FIG. 2 is a diagrammatic illustration of an example of a graphical schematic design.

FIG. 2 is a diagrammatic illustration illustrating an example of a graphical schematic design 100 that can be displayed on a display device. This example shows the schematic form of a circuit design, which is to be translated into a layout form for implementation in a circuit.

In this example, a user such as a layout designer needs to create interconnects from the input pin 102 to all of the instances 104 at the "A" pins 106, where instances 104 include instances 110, 112, 114, and 116. The user knows the magnitudes of current that are provided into each pin 106, shown as 0.5, 1, and 1.5 units in this example as shown in FIG. 2 (the units depend on the circuit implementation, e.g., milliamps). The user may have learned of these currents from any of a number of sources, such as a computer simulation of the circuit functionality, or information provided from one or more designers of the circuit.

All of the process requirements (including rules) imposed on the design must be followed in creating the layout design. The schematic representation 100 shown in FIG. 2 is symbolic and therefore the logical wiring shown does not represent the layout topology of the physical layout that is to be created. Thus, the logical wire connections shown in FIG. 2 do not have any indication of their required widths for the physical layout. In addition, a single wire shown in the schematic representation 100 can end up as multiple wires in the physical layout. For example, the schematic instance 116 is an iterated instance having 8 instances in the physical layout, where each of the instances requires a wire connection of a potentially different width than for the other instances 104.

Figure 3:
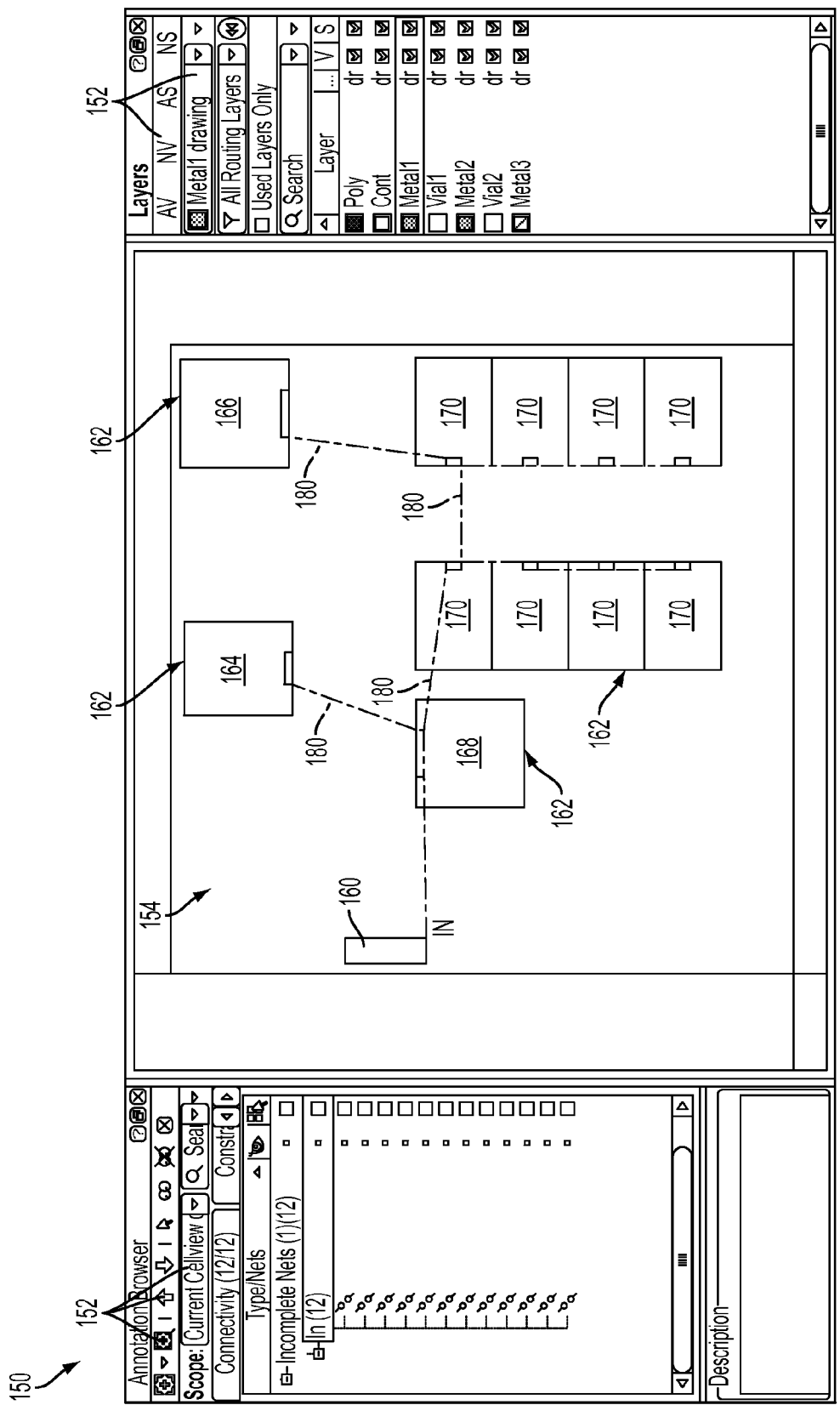
FIG. 3 is a diagrammatic illustration of an example embodiment of a graphical interface and image of a design displayed on a display device by a viewing and editing application.

FIG. 3 is a diagrammatic illustration of an example embodiment 150 of a graphical interface and image of a design displayed on display device 16 in communication with computer system 10 by a viewing and editing application 15. The interface is shown as one or more displayed windows within a graphical user interface, but can be displayed in other forms in other interfaces. In the displayed interface 150, various controls 152 are displayed such as menu items and buttons which allow the user to select various viewing and editing functions of the application and interface 150.

The interface 150 also displays a main image 154 which is created and/or edited by a designer using functions of the application 15 and interface 150. The image 154 displayed in the interface 150 can be part of a complete, larger image or "canvas" (i.e., displayable or editable work area, or complete set of data of interest to the user) that is stored in the memory 14 or other data storage of the system 10, where only part of the complete canvas is displayed in the interface 150 at one time. Alternatively, or at other zoom levels, the image 154 can be the complete canvas.

In the example embodiments shown herein, a circuit layout design application 15 is being used on system 10 and provides the interface 150. This application allows designers to create and edit layouts for integrated circuits, circuit boards, or other electronic designs (and may have many other functions, not detailed here). For example, the layout design application of interface 150 displays an image 154 which depicts an integrated circuit layout displayed having various graphical shapes that represent various components of the design, such as input pins or other connection pins, transistors, contact pads, and/or other electronic components. The user can create, add, delete, or modify the components in the image 154 and canvas, which can modify a data model of these components that corresponds to the displayed components. Furthermore, wire connections can be provided between the components to allow electrical currents to flow to and from the components.

The design displayed in interface 150 is associated with a data model that is an underlying functional representation of the design specified based on functions and parameters of the design. This data model includes a representation of each component in the design as well as the wire connections between components. Furthermore, the physical dimensions of the components and connections (i.e., the physical layout) of the design can be included in the data model. The data model thus includes the "connectivity" of the layout. For example, the software records how each component of the canvas is connected to the other components of the canvas, and in some embodiments knows the types, functions, and/or other characteristics of the shapes. The data model including connectivity information can be in any desired form and stored in any available storage device such as memory, hard disk, etc., such as a connectivity information database from which components and their connections are referenced and retrieved. For example, the connectivity information for the schematic representation 100 can take the form of a netlist showing connections and/or other relationships between identified components.

In the example of FIG. 3, a graphical layout of a circuit is displayed in image 154 showing at least a portion of the layout. In this example, the schematic circuit 100 of FIG. 2 has been partially provided in physical layout form, where the instances of circuit 100 have been placed as components as is often performed first when creating a layout design. Specifically, the input pin 102 of schematic 100 has been created in the layout design as input pad 160. The instances 104 have been created as components 162, including instance 110 as component 164, instance 112 as component 166, instance 114 as component 168, and instance 116 as components 170. These components 162 have been positioned in the layout design according to physical requirements of the circuit and circuit substrate on which the circuit is implemented. The instance 116 represents multiple instances and has been expanded into eight actual components 170a-170h. The components can be any electrical component, such as a contact pad, transistor, etc.

It should be noted that this is just one example of placement of the instances of the schematic design, used for explanatory purposes herein. In other embodiments or uses of the connection features herein, the placement of instances or components need not all be performed initially and can occur iteratively with the connection creation described below.

The lines 180 ("flight lines") can be displayed in some embodiments to indicate the connectivity between components that needs to be created for the design. These lines do not represent an actual physical topology for the design, but rather are a visual aid for a designer, giving an indication as to which components need to be connected as part of an interconnect network.

Figure 4:
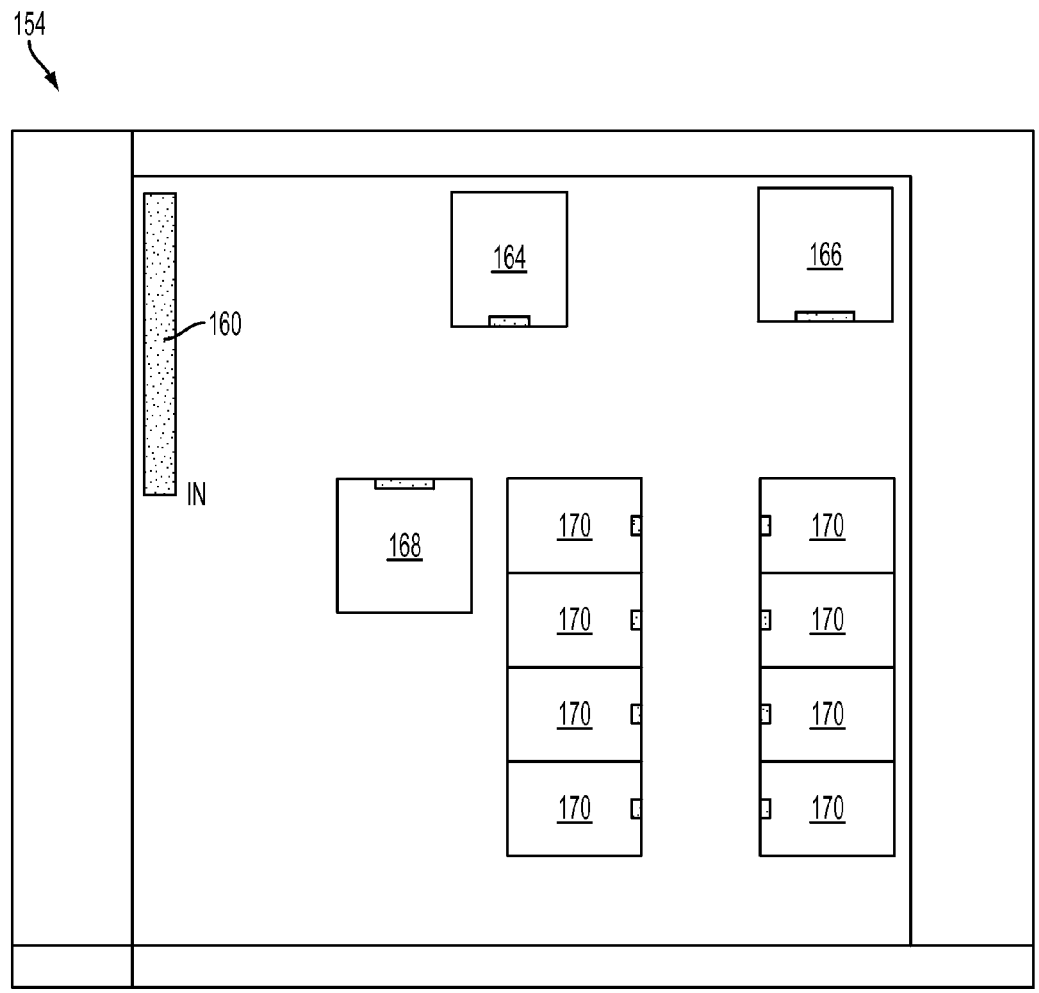
FIG. 4 is a diagrammatic illustration of the design image of FIG. 3 after currents have been determined and the input pin correctly sized.

FIG. 4 is a diagrammatic illustration of the design image 154 of FIG. 3 after currents have been determined and the input pin 160 correctly sized. In the design process, the designer will add connections such as wire segments and vias to connect the components of the design. The connections are simulated as, and are intended to be implemented with, a conductive material, such as metal or metal alloy or other conductor, which can carry electrical current between components. The sizes of wire segments and via placement and size can be determined by predetermined requirements such as equation relationships and other rules that, for example, prevent or reduce undesired wire effects such as IR drop and electromigration. In the examples described herein, a simplistic linear formula is used for the width dependency of the wire segments between components. For all conductive (such as metal) layers, a simple linear dependency of $w=I*1.2$ is assumed, where w is the width of the wire and I is the current through that wire. In addition, a simple rule is used for the required number of via cuts: for each 0.5 units of current, a via cut is required. In other embodiments more complicated rules can be used, and such rules can be swapped in the appropriate parts of the described embodiments. The particular calculations that can be used to determine wire widths and vias are not described herein, as they are well-known.

In some embodiments, a designer can first compute the total current that is consumed by the circuit design or net. The designer can use the currents known from a received specification of the design, such as the currents shown in the example schematic 100 of FIG. 2, or received from other known sources. In this described example, the total current can be calculated as $8*0.5+2*1.5+1=8.0$ units of current, which is the current through the 8 components 170, plus the current through the components 166 and 168, plus the current through the component 164. Based on the simplified example rule for determining wire widths, the input pin 160 is required to have a width of $w=8.0*1.2$, or 9.6. This width is shown for input pin 160 in FIG. 4. It should be noted that in other embodiments, the designer does not need to determine the proper width for the input pin 160. For example, the pin width can be determined and changed automatically by the assistive design feature described herein, similarly to determining the connection widths as described in some embodiments below, e.g. immediately after the input pin is drawn or placed in the design by the designer.

Figure 5:
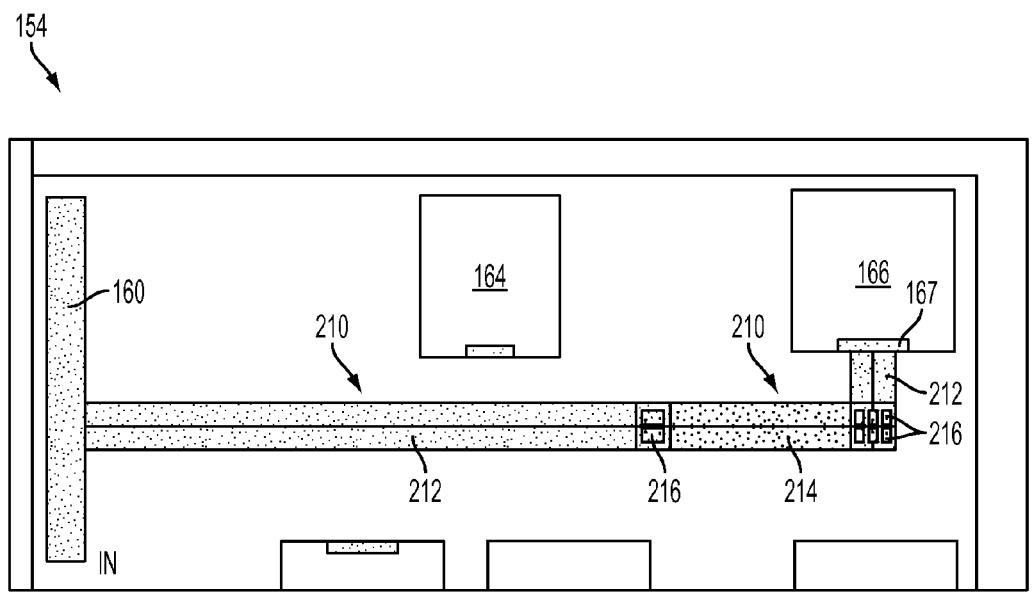
FIG. 5 is a diagrammatic illustration of a portion of the design image showing an interconnect network including a first wire connection created in the design.

FIG. 5 is a diagrammatic illustration of a portion of the design image 154 showing an interconnect network including a first wire connection created in the design. The designer has started by modifying the interconnect network by creating a wire segment 210 between the input pin 160 and the connection pin 167 of the component 166. In some embodiments, the designer can start the layout design by creating wire connections for the components which require the largest amount of current, since the segment widths are larger and less flexible as to placement. The component 166 requires 1.5 units of current and (with component 168) has the largest current requirement. In other embodiments, components having smaller current requirements than other components of the design can be connected first.

The wire segment 210 is initially provided with a default wire segment width which is shown in FIG. 5. For example, the drawing tool used by the designer may have such a default width for all wires drawn. However, this width is not correct according to the predetermined rules governing wire widths. The wire segment should have a larger width according to the width formula described above. It should be noted that, in some embodiments, the wire segment 210 of FIG. 5 is never displayed if it needs to be adjusted to one or more different widths (or has other configuration changes). In other embodiments, the segment 210 can be displayed before being adjusted to the correct size, so as to provide feedback to the designer as to the operation being performed.

Wire segment 210 can also in some embodiments be provided with different characteristics. The example of FIG. 5 shows wire segment 210 being composed of multiple conductive layers (e.g., metal layers), including segments 212 provided on one metal layer of the design, and segment 214 provided on a different metal layer. Break vias 216 can be created manually by the designer or automatically by the editing tool to connect the wire segments on different conductive layers.

Figure 6:
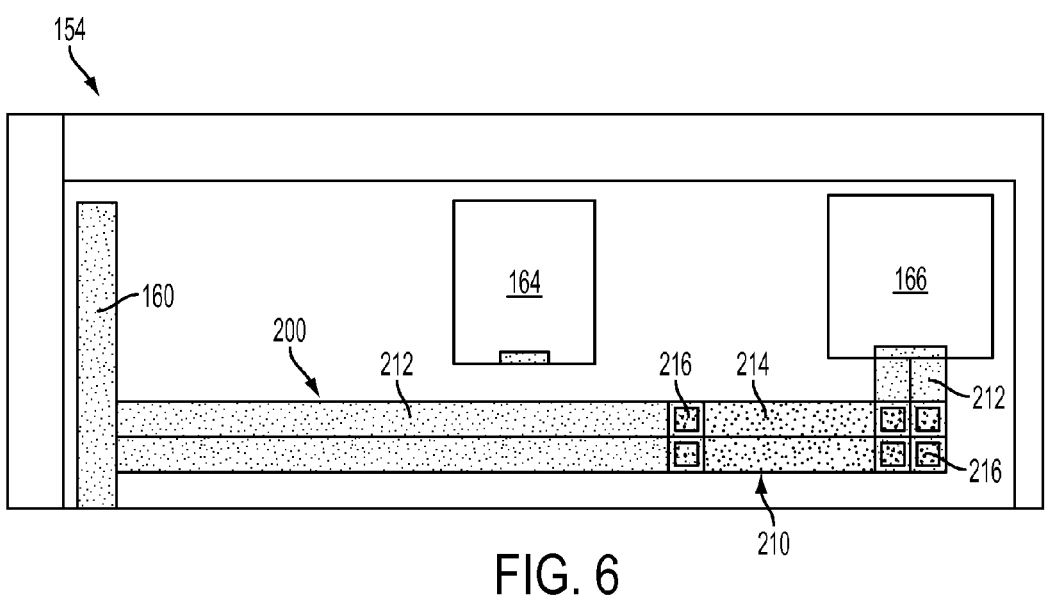
FIG. 6 is a diagrammatic illustration of a portion of the design image showing the design after the interconnect network has been adjusted by the assistive editing features based on the first wire connection.

FIG. 6 is a diagrammatic illustration of a portion of the design image 154 showing the design after the interconnect network has been adjusted by the assistive editing features based on the first wire connection. The assistive design feature as described herein defines the interconnect network that has been created so far at a particular predetermined stage and applies an adjustment technique to check whether adjustment of any wire segments and/or other features is needed, before the interconnect network is completed. In some embodiments, that check occurs immediately after each modification the designer makes to the interconnect network, such as completing a wire segment between two pins or components, or creating a via cut for a via. In this example, in response to the designer connecting the input pin 160 to the connection pin of component 166 via the segment 200, the assistive design feature defines the interconnect network to include input pin 160 and wire segment 200, and checks the wire segments of the defined network. In other embodiments, the defining and check can occur at a different time or based on a different event or criteria. For example, the check can occur at each time a predetermined period of time elapses. In another embodiment, the check can occur after a predetermined number of connections are completed, where all the wire segments created since the last check are checked for adjustment.

The assistive design feature checks the wire segments and vias of the interconnect network to determine if predetermined requirements are met, including checking the newly-created wire segment (if any) and all wire segments connected to the new segment. This check includes determining the required sizes (e.g. widths) for the wire segments, as well as required placement and sizes of vias according to the predetermined requirements. In the case of the wire segment 210 of FIG. 5, the width requirements for this segment are found to have been violated. If requirements are not met, the assistive design feature can corrects the violations by adjusting the wire segments and/or vias. For example, the widths of the violating connections can be increased as required. As shown in FIG. 6, the wire segment 210 has been increased in width relative to its original width shown in FIG. 5. Segment 210 is displayed in the image 154 of the interface 150 for the designer to view after the adjustment is made. The segment 210 includes portions 212 and 214 that have increased in width on different conductive layers. Furthermore, the vias 216 are increased in size and/or number as appropriate for the corrected width of the line 210.

Thus, the topology of the interconnect network is specified by the designer or other user, while the calculations needed to meet the current-driving rules (or other rules) are made by the assistive design feature, in an iterative and dynamic fashion while the designer is creating wire segments and vias in the network. This allows the designer to see the corrected segments and vias as he or she is designing and adjust segments and vias if necessary on the fly, rather than checking the design after the interconnect network has been completed (e.g., when all segments of the interconnect network have been created), and having to make changes potentially much greater in scope and number at that stage.

Figure 7:
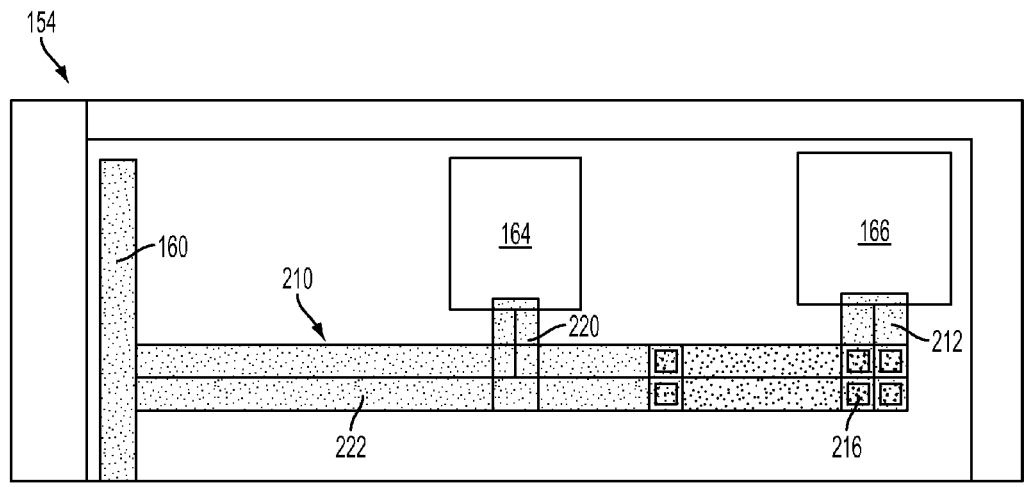
FIG. 7 is a diagrammatic illustration of a portion of the design image showing a second wire connection created in the design.

FIG. 7 is a diagrammatic illustration of a portion of the design image 154 showing a second wire connection created in the design. In FIG. 7, the designer has added a wire segment stub 220 which connects to the trunk wire segment 210 and to a pin connection of the component 164. Component 164 is known to require a current of 1.0 units as indicated in the schematic of FIG. 2. In this example, the default width of the stub 220 is correct to carry this amount of current according to the predetermined requirements. Therefore, when the assistive design feature checks the interconnect network after the creation of stub 220, it is determined that no adjustments need be applied to the stub 220.

However, it is also determined that the segment 222 of trunk segment 210, which extends from the input pin 160 to the stub 220, is now carrying the sum of currents required for both components 164 and 166. In this example, this sum is equal to 1.0 units plus 1.5 units, or 2.5 units. Therefore, the existing width of this segment 222 now violates the width requirements.

Figure 8:
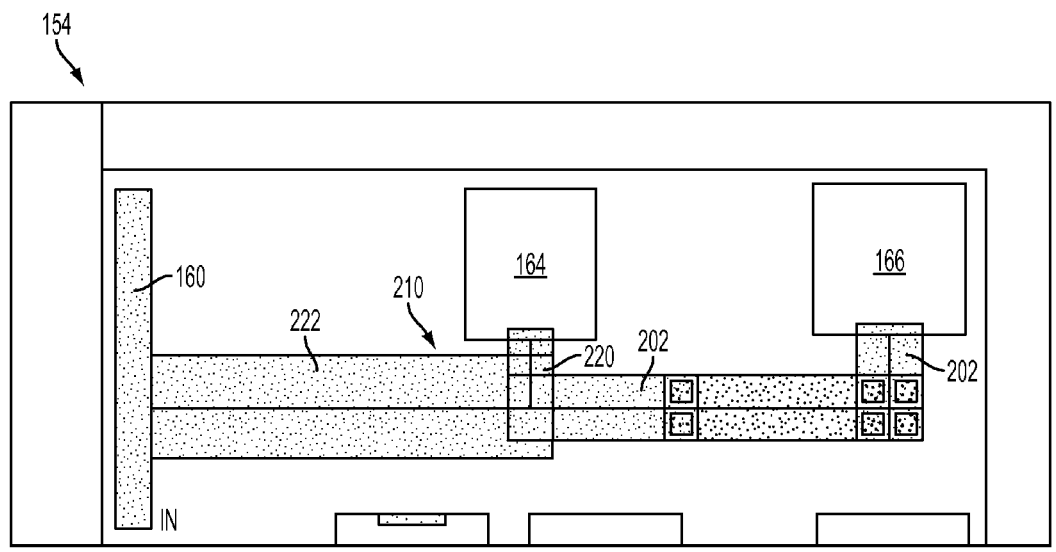
FIG. 8 is a diagrammatic illustration of a portion of the design image showing the design after the interconnect network has been adjusted based on the second wire connection.

FIG. 8 is a diagrammatic illustration of a portion of the design image 154 showing the design after the interconnect network has been adjusted based on the second wire connection. Since the segment 222 must be widened to allow for the greater current in that segment, the assistive design feature determines the amount to be widened using the applicable rules, and changes the width of the segment 222. The new stub 220 and the newly-widened segment 222 are then displayed in the image 154. As shown in FIG. 8, the width of segment 222 is displayed wider than the portion of segment 202 extending to the right of the stub 220 to accommodate the greater amount of current. To the right of stub 220, only current for component 166 is carried and so the trunk segment 210 retains its previous width for this portion. Similarly for the segment 210 above, the uncorrected segment 222 of FIG. 7 can be displayed in some embodiments before the adjusted segment is displayed, or the uncorrected segment can be immediately replaced by the adjusted segment as soon as a interconnect network check occurs (e.g., as soon as the stub 220 is completed to connect the segment 210 with the component 164).

Figure 9:
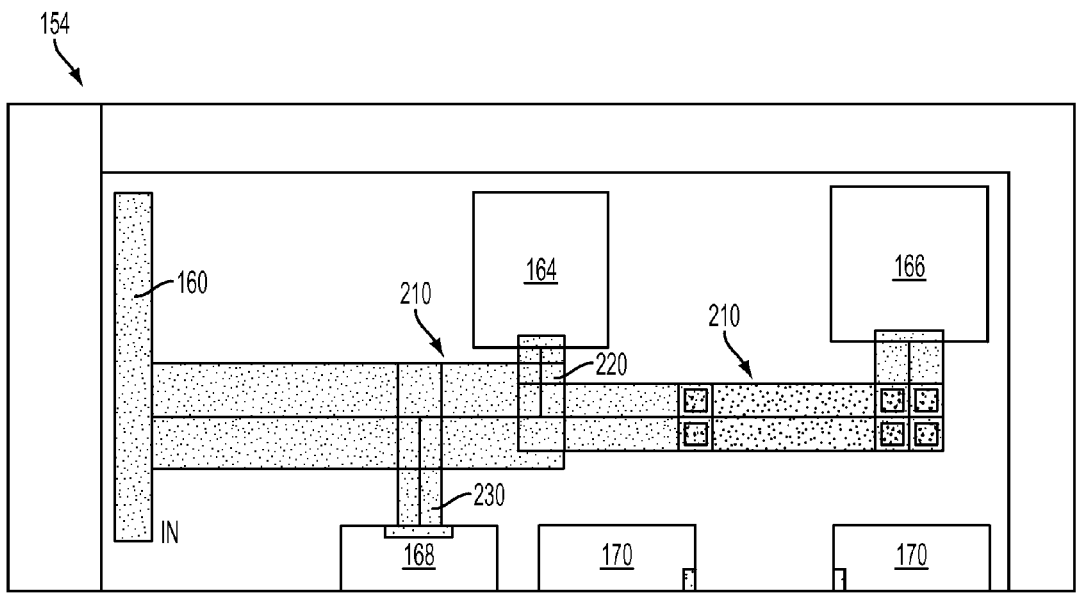
FIG. 9 is a diagrammatic illustration of a portion of the design image showing a third wire connection created in the design.
Figure 10:
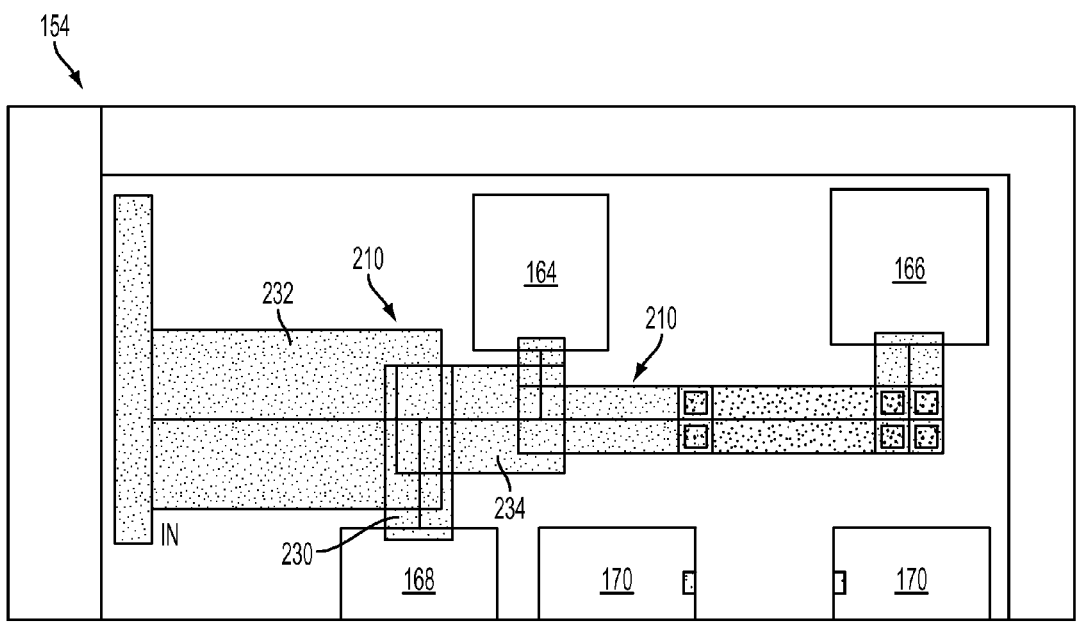
FIG. 10 is a diagrammatic illustration of the portion of the design image showing the design after the interconnect network has been adjusted based on the third wire connection.

FIG. 9 is a diagrammatic illustration of a portion of the design image 154 showing a third wire connection created in the design. In this next step of network creation, the designer now creates a wire segment or stub 230 from the line 210 to the component 168. As shown in the circuit of FIG. 2, component 168 requires 1.5 units of current, which requires a greater width than the default segment width provided by the editing tool. In some embodiments, the stub 230 can be initially drawn in the default width as shown in FIG. 9, and then can be adjusted and displayed by the assistive design feature at a width that accommodates the 1.5 units of current, as shown in FIG. 10. In addition, the assistive design feature checks the remainder of the interconnect network defined at the time of the check (after stub 230 is completed), such as the segments connected to the stub 230, to determine if any other adjustments are required. The assistive design feature finds that the segment 232 of the segment 210 that extends from the input pin 160 to the stub 230 now carries current for three components 164, 166, and 168 and must be widened relative to the width shown in FIG. 9 according to the predetermined requirements.

FIG. 10 is a diagrammatic illustration of the portion of the design image 154 showing the design after the interconnect network has been adjusted based on the third wire connection. In FIG. 10, the assistive design feature has performed the calculations and adjusted and displayed the stub 230 at the proper increased width to accommodate 1.5 units of current. The assistive design feature also performs the calculations and automatically widens and displays the segment 232 of segment 210 as shown in FIG. 10. The widening of segment 232 can cause a portion 234 of segment 210 between the stub 230 and the stub 220 to be displayed as its own wire segment. The assistive design feature can display these adjustments at the same time, immediately after the designer has completed the connection of the stub 230 to the segment 210, or at a later time during the design process as described above.

In some embodiments, the assistive design feature can present each change to the interconnect network as a proposal to the designer (e.g., showing the intended change as dashed lines, different fill pattern, or as some other indication), which the designer can accept or reject.

Figure 11:
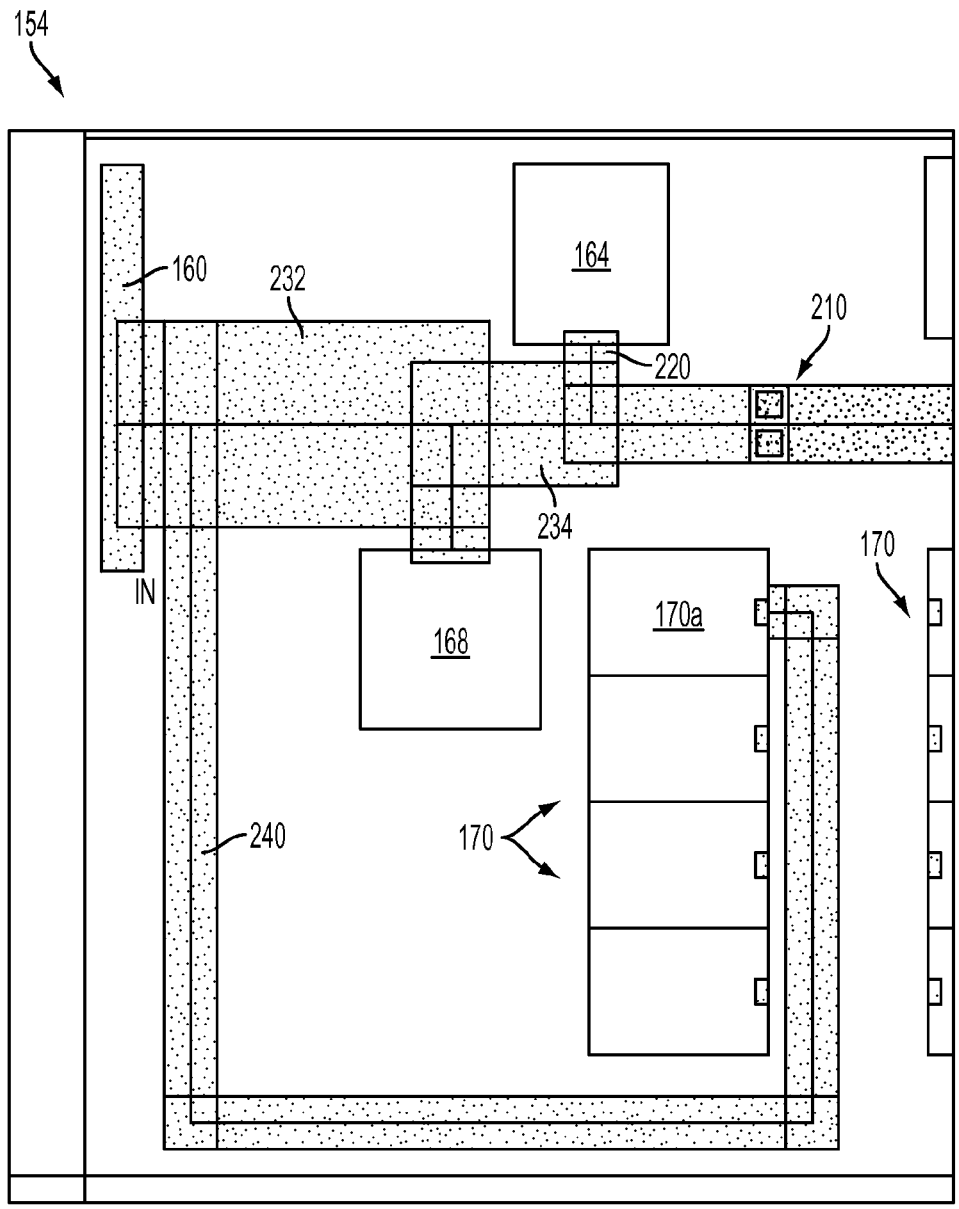
FIG. 11 is a diagrammatic illustration of a portion of the design image showing a fourth wire connection.

FIG. 11 is a diagrammatic illustration of a portion of the design image 154 showing a fourth wire connection. At this stage of the design, the designer wishes to connect the eight components 170 to the input pad 160. A designer or automated tool might try to make the connections using a stub connected to the segment 210 currently routed between the input pin 160 and the component 166 (see FIG. 18). However, since the segment 210 and segments 232 and 234 have been resized iteratively and dynamically as the connections are being made, it becomes obvious to the designer that there is not enough room to the sides of the segment 210 to accommodate more width for the additional current to the components 170. Therefore, the designer can easily conclude that the components 170 must be connected by a different path than from the right side of segment 210.

In FIG. 11, the image 154 shows the designer has selected a lower path in which to connect the input pad 160 to the array of eight components 170. The designer has drawn a wire segment 240 using the editing tool, which connects the input pad 160 to the connection pin of a first component 170a of the components 170. The connection segment 240 is shown in FIG. 11 at its default width when created by the designer, and may or may not be actually displayed at this width depending on whether it will be adjusted and such an embodiment implemented.

Figure 12:
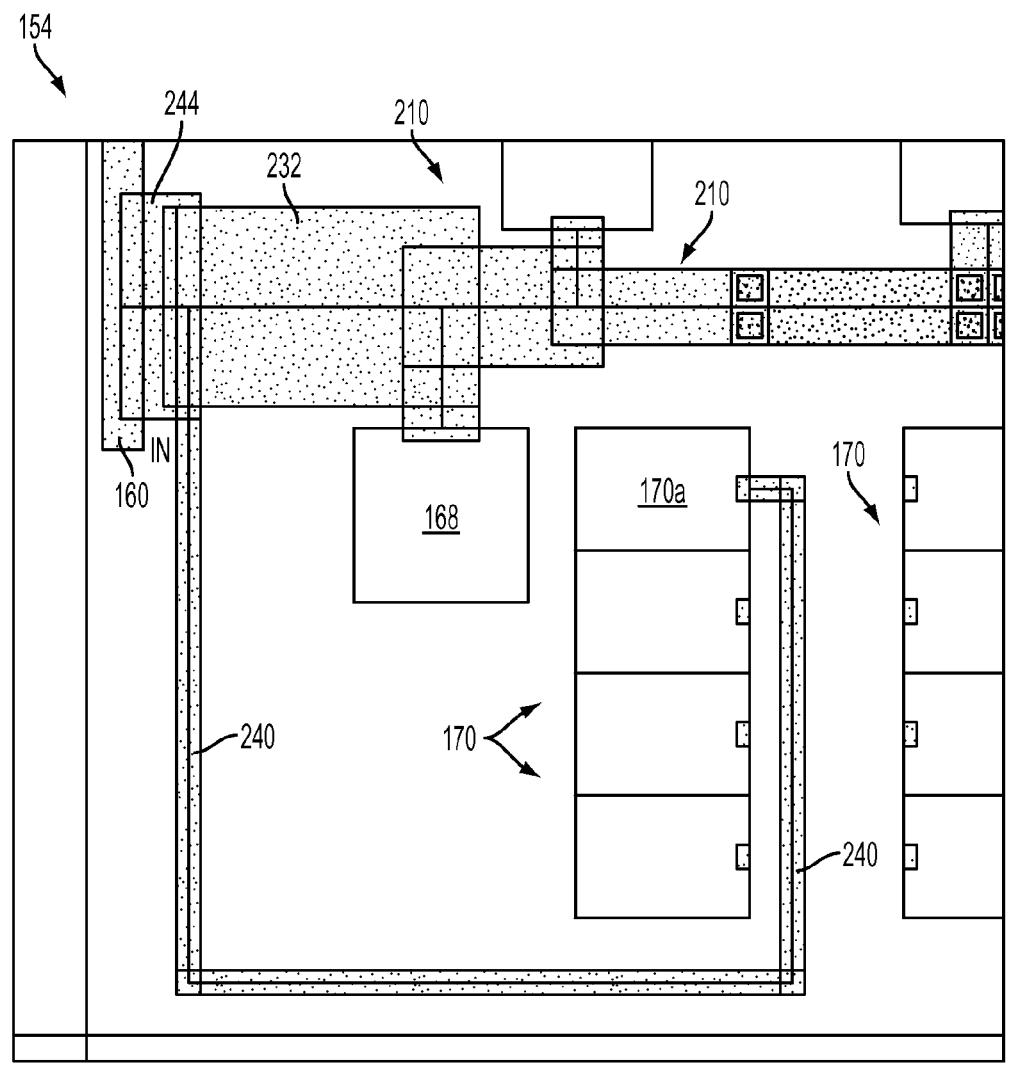
FIG. 12 is a diagrammatic illustration of a portion of the design image showing the design after the interconnect network has been adjusted based on the fourth wire connection.

FIG. 12 is a diagrammatic illustration of a portion of the design image 154 showing the design after the interconnect network has been adjusted based on the fourth connection. After defining the new interconnect network to include segment 240, the assistive design feature determines that the component 170a to which the connection line 240 is connected requires 0.5 units of current and the default width of the line 240 as shown in FIG. 11 is larger than the width required to carry this current. In some embodiments, the segment 240 is corrected to a smaller width as allowed by the current and the predetermined requirements, as shown in FIG. 12. In other embodiments, a wire width larger than the required width can remain in the design uncorrected. A wire having greater than the required width is not a cause for circuit failure and may accommodate greater currents, but can cause loss of area in which to place components or other wire segments on the substrate (e.g., circuit board or other substrate). Reducing wire segment widths to the required size therefore can optimize the area taken by the circuit. Some embodiments can provide an immediate option for the user to select whether to keep larger-than-required widths or to decrease these widths to the minimum size needed. In some embodiments, predetermined user preferences (e.g., stored on a storage device of the system 10) can be read by the assistive design feature to determine whether such larger widths are kept or reduced.

In addition, the assistive design feature checks the rest of the interconnect network including other wire segments connected to the newly-created segment 240. In this example, a main trunk portion 244 of the segment 232 of segment 210 is found to be too narrow to accommodate the additional 0.5 units of current needed for the new connection to the component 170a. Therefore the portion of segment 232 between the input pin 160 and the line 240 is widened, creating another segment 244 that is connected between input pin 160 and the now shortened segment 232, as shown.

Figure 13:
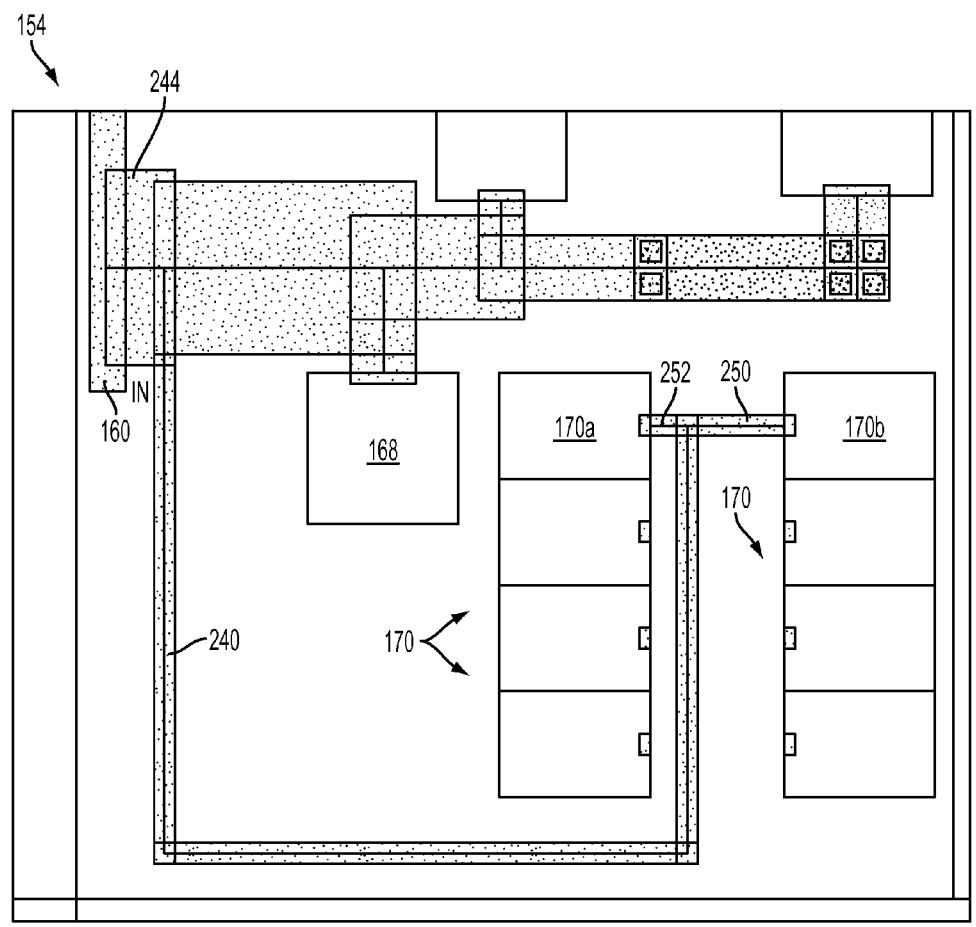
FIG. 13 is a diagrammatic illustration of a portion of the design image showing a fifth wire connection.

FIG. 13 is a diagrammatic illustration of a portion of the design image 154 showing the interconnect network of FIG. 12 and a fifth wire connection. The designer wishes to connect another one of the eight components 170 to the input pad 160, and creates a connection segment 250 between the trunk segment 240 and a connection pin of the component 170b. The connection segment 250 is shown in FIG. 13 at a reduced width, since in one example a drawing tool can be used to extend the existing segment 252 to create segment 250 extending to component 170b, and segment 252 is already at this reduced width. In other embodiments, the new segment 250 can be created at a default width, which may then be reduced by features described herein.

Figure 14:
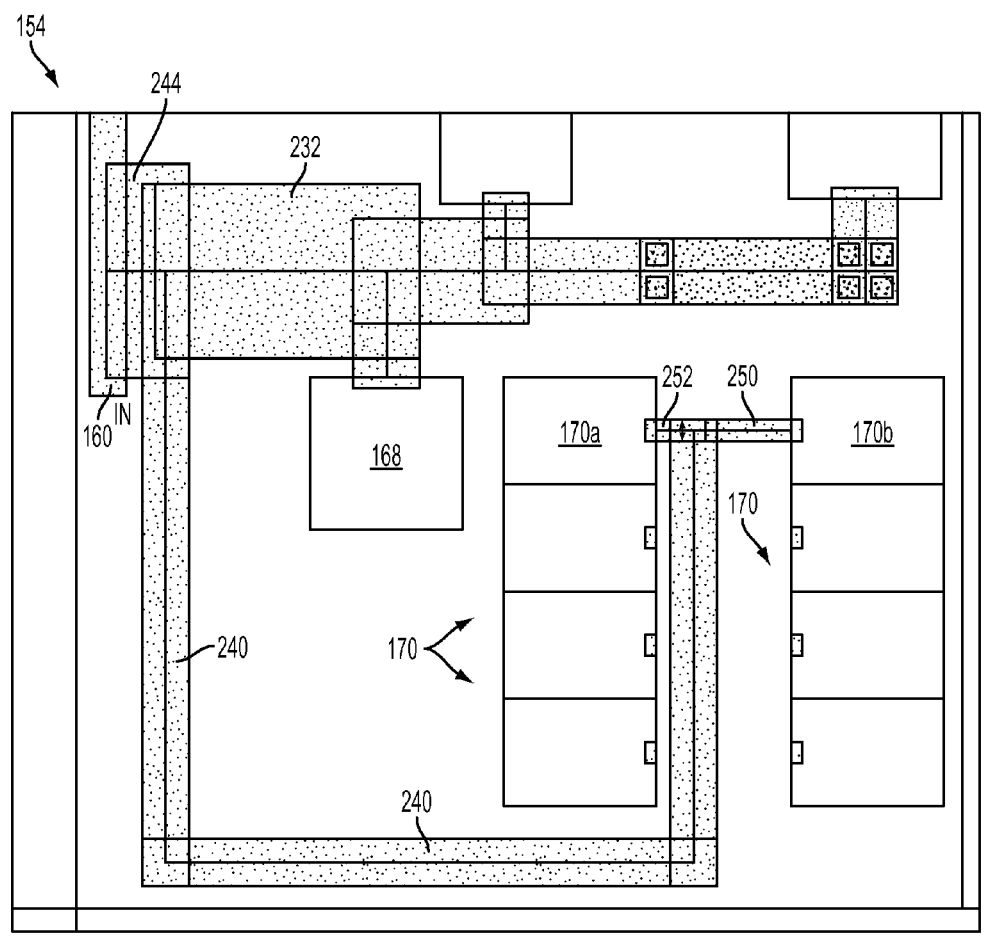
FIG. 14 is a diagrammatic illustration of a portion of the design image showing the design after the interconnect network has been adjusted based on the fifth wire connection.

FIG. 14 is a diagrammatic illustration of a portion of the design image 154 showing the design after the interconnect network has been adjusted based on the fifth wire connection. It is found by the assistive design feature that the component 170b to which the wire segment 250 is connected requires an additional 0.5 units of current. The added segment 250 can support this current at the existing width, as shown. However, the segment 240 now must carry two currents, one for each of the components 170a and 170b. Thus the assistive design feature determines that the segment 240 must be increased in size to the width shown in FIG. 14 to meet the requirements. In addition, the assistive feature checks the other connected segments and determines that the main trunk segment 244 must be increased in width to accommodate the additional current flowing to the newly-connected component 170b. The assistive design feature therefore adjusts the width of the segment 244 in addition to adjusting the width of line 240.

Figure 15:
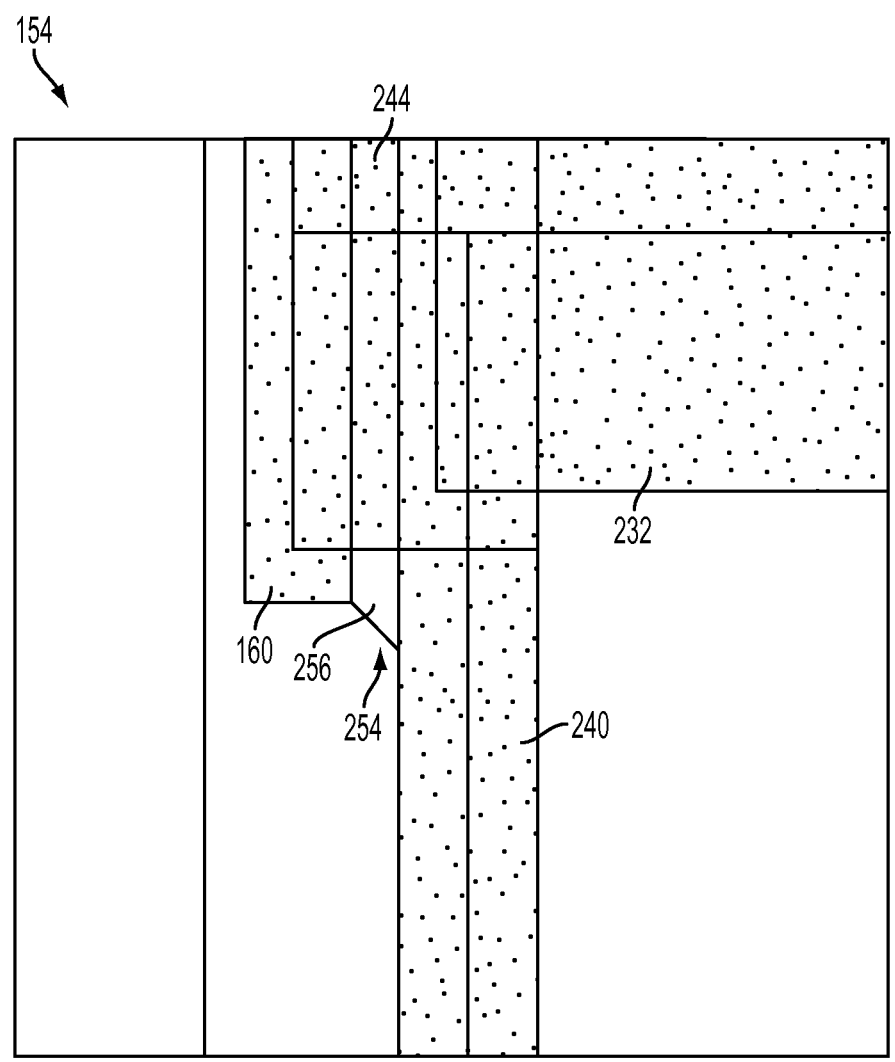
FIG. 15 is a diagrammatic illustration of a zoomed-in portion of the design image showing the input pin and wire segments connected to the input pin.

FIG. 15 is a diagrammatic illustration of a zoomed-in portion of the design image 154 showing the input pin 160 and wire segments connected to the input pin. In the current example, at this stage of the circuit design process as detailed above, a design rules check (DRC) violation can be present, as detected by the designer examining the circuit or by an interactive DRC engine. The violation in this example is a gap 254 that is present between the input pin 160 and the line 240. However, this gap 254 may no longer be present after more wire segments are added as in the present example and the trunk segment 244 is widened due to additional connected wire segments. If the designer can anticipate that a violation will be naturally corrected at a later stage of the network modifications, e.g. in response to additional connection segments being created, then the violation can be currently ignored. However, in other cases it is known that a violation such as the gap 254 will remain a violation in the design until completion unless corrected, such as when no more network modifications are to be made to the circuit design.

In some embodiments, violations such as gap 254 can be corrected using a gap filling tool. Such a tool is available on some existing layout editors, and can provide a conductive connection 256 as shown to fill the gap and provide a continuous edge between the pin 160 and the wire segment 240. In other embodiments, a 2D compaction tool can be used locally to adjust the DRC such that the gap 254 is no longer a violation. Some embodiments can provide an option or choice to the user whether or not to immediately correct the DRC violations created during the design process.

Figure 16:
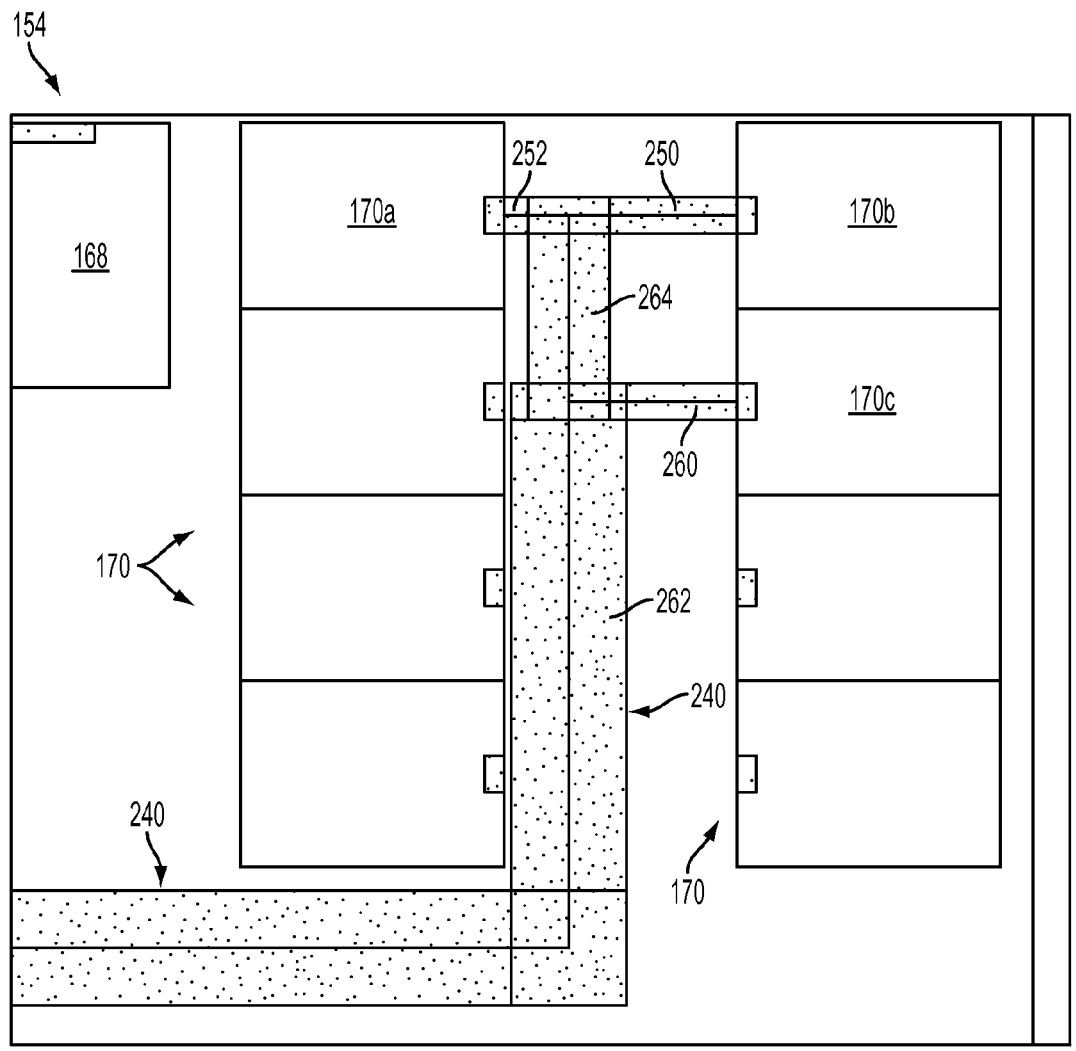
FIG. 16 is a diagrammatic illustration of a portion of the design image showing the design after interconnect network has been adjusted based on a sixth wire connection.

FIG. 16 is a diagrammatic illustration of a portion of the design image 154 showing the design after the interconnect network has been adjusted based on a sixth wire connection. The designer has completed another stub 260 between trunk segment 262 and component 170c, and it is determined that component 170 requires an additional 0.5 units of current. The added line 260 can support this current at the existing width, as shown. However, a portion of the trunk segment 240 now must carry the additional current for component 170c, for a total of three currents for each of the components 170a, 170b, and 170c. Thus the assistive design feature determines that the segment 240 must be increased in size to the width shown in FIG. 16. Only the segment portion 262 of the segment 240 positioned between the stub 260 and the input pin 160 carries the third current and requires the additional width.

The segment 264 of segment 240 between the stub 260 and the stubs 250 and 252 does not need to be adjusted since it carries two currents.

Although it is not yet a problem in this example design, it may become apparent to the designer that the trunk segment portion in the middle of the array of components 170 may start overlapping the components 170 on the left side as more connections are added. At this point in the design process, the designer can choose to manually adjust the trunk segment 240 by moving or "stretching" its vertical portion to the right, re-centering that portion of segment 240. The designer may alternatively be able to change the metal (or other conductive material) of the future-overlapping conductive wire segments if a different metal or other conductor is known to have a smaller sheet resistance that would cause the width of the wire segment 240 to be smaller. The user may also simply wait until the overlap becomes an actual problem later in the design process, e.g., during DRC checks. For example, if an overlap occurs, such overlap can be detected by an interactive DRC engine in some embodiments, which can trigger a DRC fixer to correct the overlap, such as a 2D compaction engine. In the described example, it is assumed that the segment 240 has been adjusted to be centered between the left and right columns of components 170, e.g., by the designer stretching the segment 240 to the right using editing functions of the editing tool. In other embodiments, the centering of the segment 240 and/or other repositioning of wire segments can be performed by an automated tool after violations have been detected, or when directed to do so by the designer.

Figure 17:
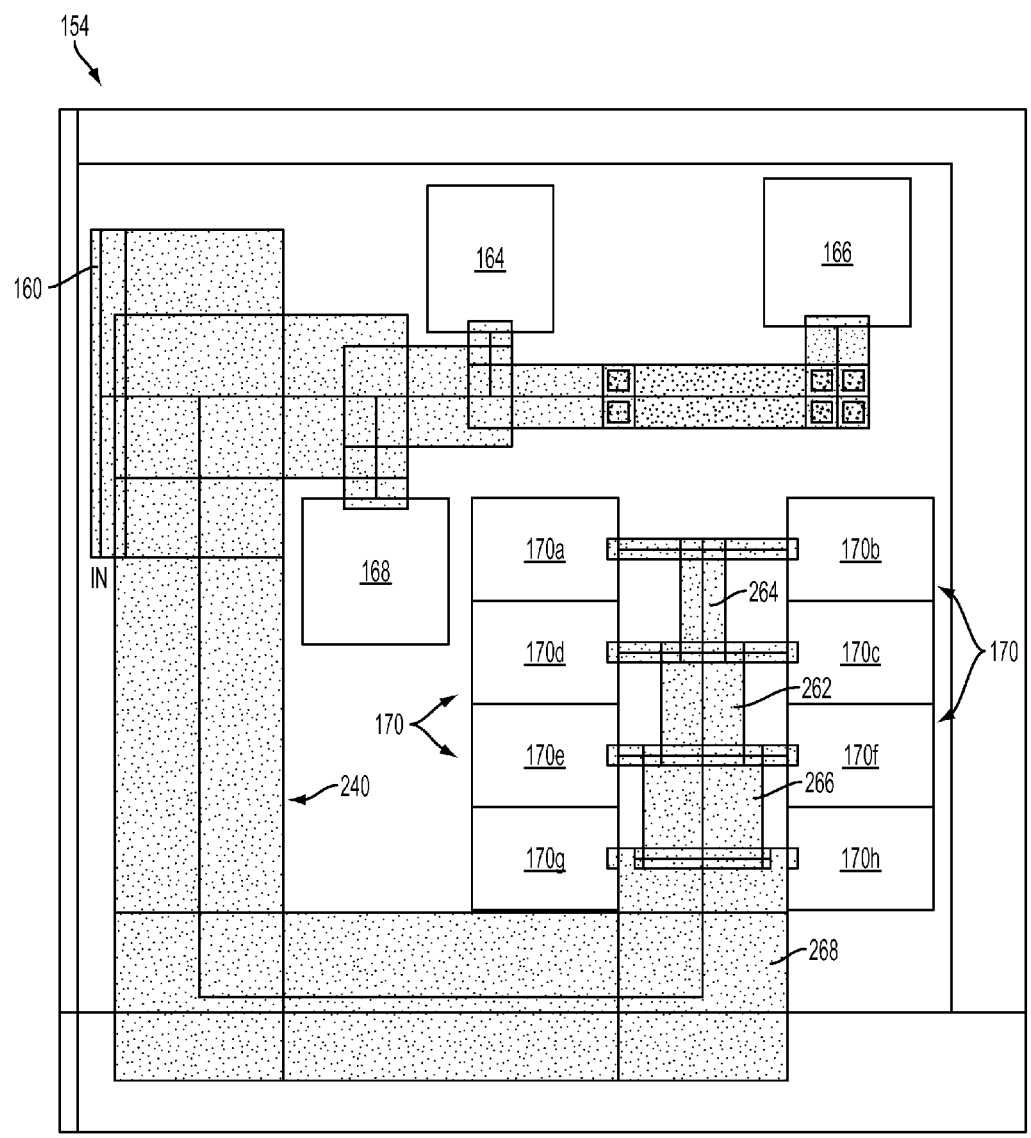
FIG. 17 is a diagrammatic illustration of the design image showing the design after the interconnect network has been adjusted after completion.

FIG. 17 is a diagrammatic illustration of the design image 154 showing the final interconnect network after connecting all the components of the example design to the input pin 160, i.e., the completion of the interconnect network. As shown, segment 240 to the components 170 has been widened to accommodate the eight currents flowing to and from the eight components 170, where segment 264 of segment 240 carries currents for components 170a and 170b, segment 262 for components 170a-170d, segment 266 for components 170a-170f, and segment 268 for all eight of the components 170. After each component 170 is connected to the trunk segment 240 by a completed stub, the appropriate portions of the segment 240 are widened. Alternatively, after some predetermined number or designated group of components is connected, the width of trunk segment 240 is adjusted.

Figure 18:
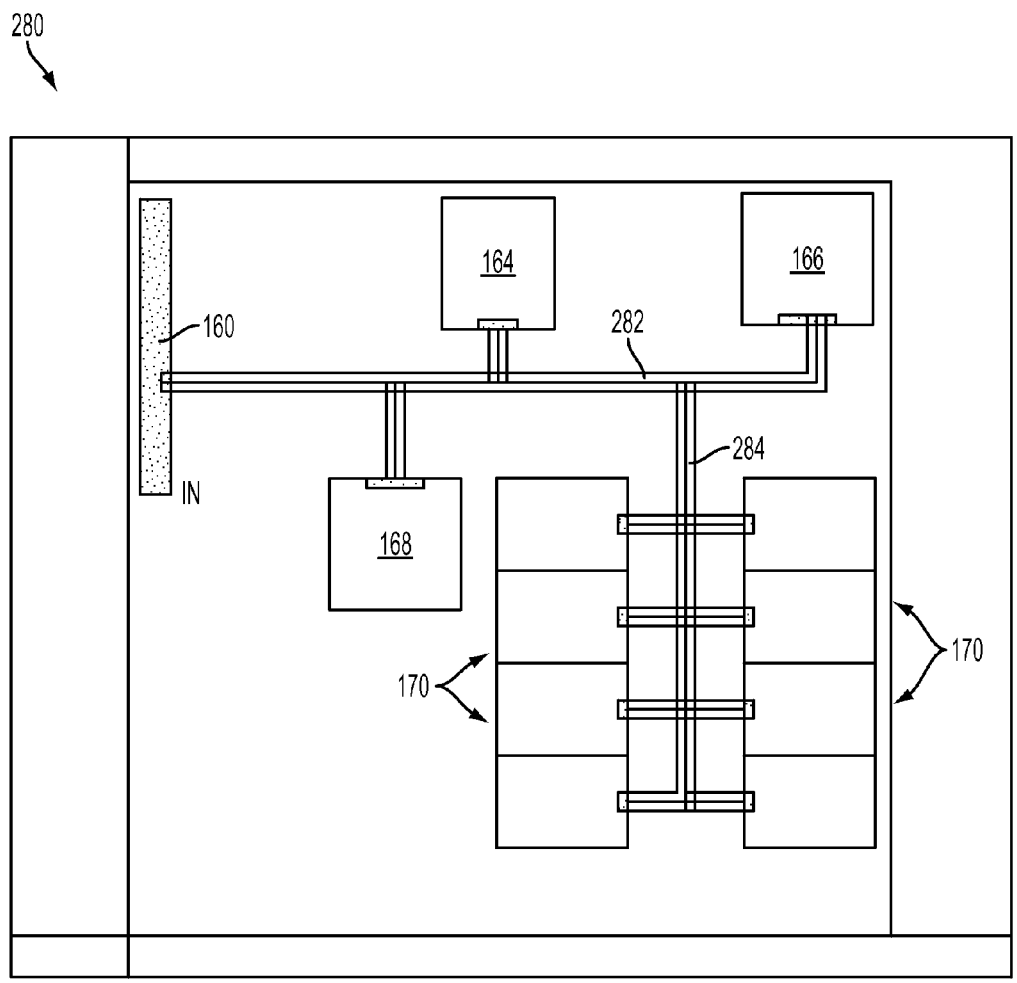
FIG. 18 is a diagrammatic illustration of an alternate design image in which the assistive design features described herein are not used.

FIG. 18 is a diagrammatic illustration of an alternate design image 280 in which the assistive design features described herein are not used. In one case, the design 280 results from the designer manually drawing or otherwise creating the segments in the design between the components. In other cases, the design 280 may result from an automated tool that routes segments automatically based on established rules. The upper segment 282 is created first, similarly to the example described above. Similarly, a segment 284 is naturally routed down between the components 170 to connect to the connection pins of these components. The most natural and direct path is to route the segment 284 from the segment 282. However, as described in the example above, this connection configuration cause the segment 282 to become too wide to fit in the existing space without overlap. When the designer checks this design after completion, this problem will then become known, and the designer will have to go back and alter the design, including re-routing the segment 284 under the components 170 as in the example described previously. By having the assistive design features of the previous example indicate and correct wire segments and vias as the designer creates them, significant time is saved in the evaluation and correction of a design.

Figure 19:
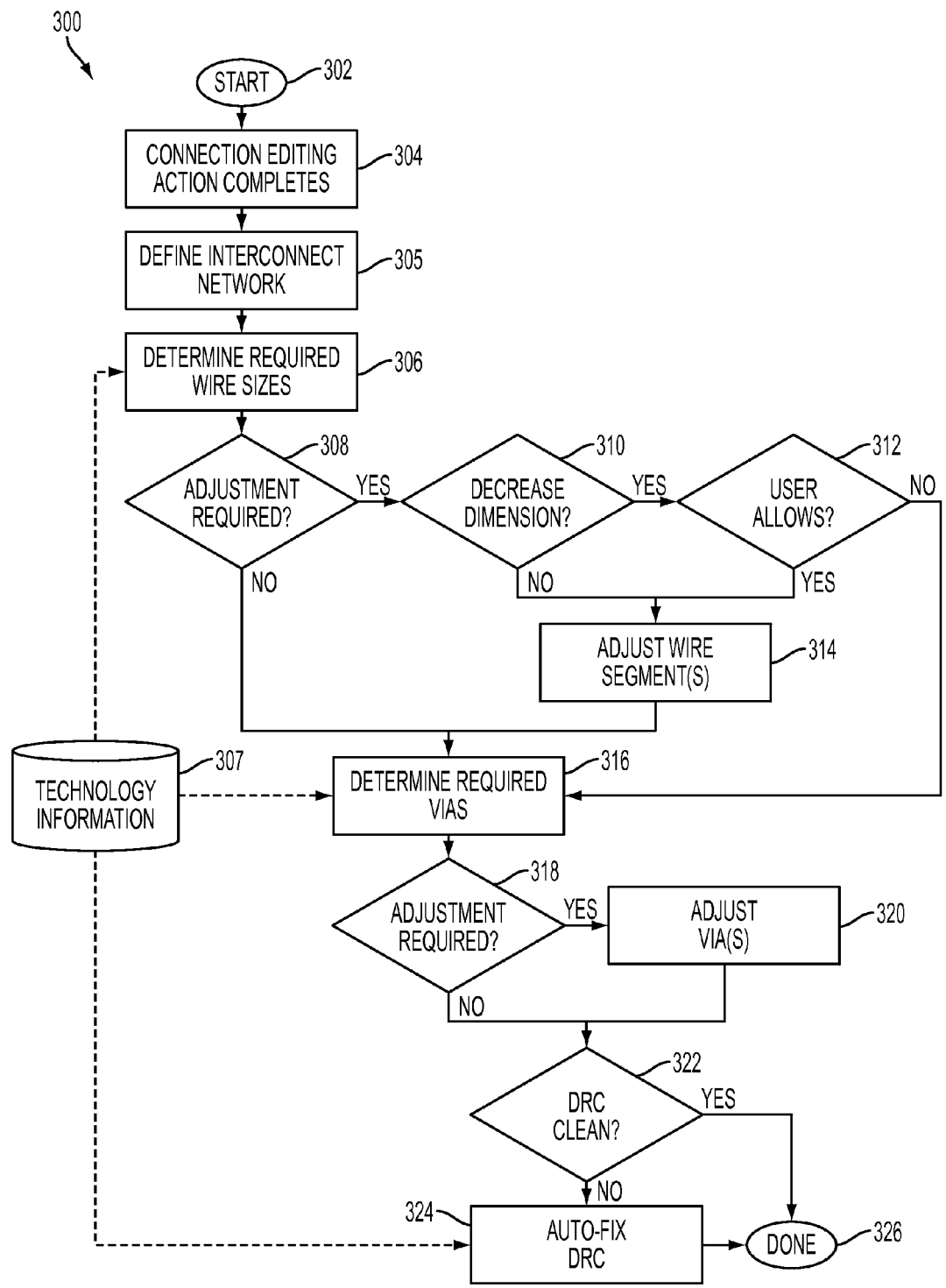
FIG. 19 is a flow diagram illustrating an example of a method of the present inventions for providing the assistive design features in a circuit design.

FIG. 19 is a flow diagram illustrating one example of a method 300 of providing the assistive design features in a circuit design as described in embodiments herein. Method 300 can be implemented, for example, by the components in system 10, including one or more CPUs/processors and a display device 16. Method 300 can be implemented by program instructions or code, which can be stored on a computer readable medium. Alternatively, the method 300 can be implemented in hardware (logic gates, etc.), or in a combination of hardware and software. The method 300 can be provided as part of or component of the graphical editing application 15, or as a separate program or software running in conjunction with application 15. It should be noted that the steps described below can be performed in a different order than shown and/or simultaneously (partially or completely) with other steps, where appropriate.

The method 300 begins at 302, and in step 304, the designer's connection editing action completes to cause a modification to the interconnect network of the circuit design. This can be an incremental modification to a wire segment or via of the interconnect network of the design (including creation and/or editing). For example, as described above, the designer may have completed a wire segment between two components or connection pins of the design. Or, the designer may have added a via to a wire segment to connect the segment to a segment on a different layer of the design. In some embodiments, vias between different layers of the design can be determined and placed by the editing program for a completed wire segment. In some embodiments, the results of this editing action are not displayed until any potential adjustment is resolved as described in below steps. In other embodiments, the results are displayed and then adjusted on the display in the following steps if necessary.

In step 305, the process defines the current interconnect network after the editing action is complete in step 304. It is this interconnect network that is used for the subsequent steps detailed below. This determined interconnect network includes all the wire segments and vias connected to a wire segment or via that was modified by the editing action of step 304. Typically, the defined interconnect network will be a partial one, not yet completed by the designer. For example, the interconnect network can be defined after each editing action as described in this embodiment, or after a number of editing actions or other condition as described above.

The method applies an adjustment technique to the defined interconnect network. In this example embodiment, the adjustment technique includes determining the required wire segments and adjusting existing wire segments (steps 306-314) and determining the required vias and adjusting existing vias (steps 316-320), based on predetermined requirements including rules to reduce or eliminated undesired wire effects such as, for example, IR drop and electromigration. Other embodiments can apply other adjustment techniques, e.g., to meet the predetermined requirements.

In step 306, the required wire size(s) are determined for the defined interconnect network including any completed wire segment and all other wire segments that are connected to the completed wire segment. In the embodiments described herein, the required widths of these connections are determined by checking the wire segments against predetermined requirements. These requirements, as well as the characteristics of the interconnect network, can be retrieved as technology information 307 stored at the same system 10 implementing the method 300, or stored at a different system in communication with the system 10. For example, the predetermined rules can provide relationships as to how to compute the widths of connections to carry the designed currents without (or with reduced) IR drop and electromigration issues, as described above. Characteristics of the interconnect network can include conductor (e.g., metal) types and characteristics for the wire segments, as well the components and their current requirements. The currents flowing through each wire segment of the defined interconnect network are determined based on the existing connections as well as components of the design as indicated by the functional data model for the design. The predetermined rules can be simpler or more advanced rules, depending on the embodiment implemented.

In step 308, it is checked whether adjustment of any of the wire segments of the interconnect network is required, including the completed wire segment (if any). Adjustment is required if any wire segments violate the requirements determined in step 306. If the requirements are satisfied and adjustment is not required, the process continues to step 316, described below. If adjustment is required, then in step 310 it is checked whether the required adjustment is a decrease in size, such as a decrease in width of any of the checked wire segments. If the adjustment is not a decrease then the process continues to step 314, described below. If the adjustment is a decrease, then in step 312 it is checked whether the user (such as the designer) allows the decrease. For example, in some embodiments the default setting of the system does not allow a decrease in segment widths, even if such decreases are within requirements, unless the user has overridden this default setting. The user may desire to allow decreases to more efficiently use the area of the design, or may not want decreases to allow overdesign in the wire segments. User preferences stored on the system 10 can be read to determine whether the user allows the decrease in segment width. Thus, if the user does not allow the decrease, the method continues to step 316.

If the user allows the decrease, or if an increase in width is required, then in step 314 the appropriate wire segments of the interconnect network are adjusted based on the required adjustments determined in steps 306 and 308. For example, wire segment widths can be increased to allow for more currents in the completed segment. In some embodiments, this step can also include designer inputs that may reposition adjusted wire segments if overlap or other rule violations occur based on the new, adjusted sizes of the wire segments.

In next step 316, one or more vias are determined for the wire segments of the interconnect network as required by the predetermined requirements, including for any completed wire segment and for any wire segments adjusted by step 314. For example, if the designer added a new wire segment in the completed editing action of step 304, then this connection may require a number of vias according to the requirements established for the design. If any wire segments of the network were adjusted in step 314, these segments may have changed in size or configuration, and vias appropriate for their new sizes and/or configuration are determined in this step, such as larger vias and/or a different number of vias appropriate for the adjusted wire segments. The step 316 can use the technology information 307 such as the functional data model, layer information, and via placement rules to determine the vias for the adjusted wire segments.

In step 318, it is checked whether adjustment is required for any existing via(s) in the interconnect network, based on a comparison to the required vias determined in step 316 for the interconnect network. For example, vias may have originally been created at particular conductive layer interfaces and having particular sizes and in particular numbers, and which now may need to be adjusted in size and/or number based on the adjustments to wire segments in step 314. If adjustment of vias is not required, then the process continues to step 322. If adjustment is required, then in step 320 the via(s) are adjusted in the design and displayed in their adjusted form.

In step 322, the process determines whether the design passes a design rules check (DRC) process or other similar predetermined design requirements. A DRC process is an automated check of the design according to predetermined design rules, which can include manufacturing process requirements. For example, some design rules can provide spatial design requirements, such as requiring that components or wire segments cannot be positioned closer than a particular minimum distance apart to achieve acceptable functionality and/or reliability of the design when implemented physically, and/or cannot be placed more than a particular distance apart. The design requirements can vary based on particular types of conductor for layers, or types of device or structure. If the design passes the DRC process and is therefore clean, the process is complete at 326. If the design does not pass the DRC process, then in step 324 the method implements (or causes or calls another process to implement) an automated fix of the portions of the design that violate the DRC. For example, compaction technology can be used. This can be implemented using technology information 307 that specify the rules as well as actions to fix design features so as to provide compliance. The process is then complete at 326.

The embodiments of the assistive design features described herein have several advantages over prior design editing tools. For example, there is no need for the creation of a topology by an automated tool for analysis of rules and requirements. Instead, the designer can fully create and drive the current distribution network to the required specifications using the assistive design features. In addition, the assistive design features allow a dynamic, incremental, and iterative method of designing which matches the thinking and drawing flow of the layout designer or engineer. For example, the designer can use the information they are given incrementally, while they are drawing connections, to correct and adjust the connections as needed. Thus, there is much less need to check a created topology after the interconnect network is completed, since that checking has been occurring dynamically during the design process, and avoids or reduces costly post-design evaluation and correction. The assistive design features also allow creation of a per-wiring segment optimized interconnect network, eliminating some "over-estimation" typical of the work done by a designer or layout engineer in a traditional interactive method.

The assistive design features further can provide instant feedback to the designer as to the space used for wire connections, allowing interactive topological/area tradeoffs for the connection network. The assistive features are fully interactive, and although complicated calculations may be performed during the design process by the assistive features, the process functions well because the computed changes are limited and incremental.

Also, the assistive design features are integrated with all the other functions of a design editor application, and the designer is allowed to sandwich other commands during the use of the assistive design features and in the middle of creating connections. For example, if an instance needs to be slightly moved to allow routing, then the user can move the instance between two routing or connection actions, if possible. Furthermore, all the other connection editing capability of the editor are fully available and unchanged, since the described tool and method adds at most one post-processing step after each connection editing action (such as after the drawing or creation of an interconnect between two or more components). Finally, the assistive design features described herein do not change the existing use model of design layout application software, so that layout engineers can continue performing connection editing using the same commands and functions with which they are already familiar.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A computer implemented method for providing a circuit design, the method comprising:
   determining that one or more new wire connections have been added to an existing interconnect network comprising a plurality of existing wire connections that connect a plurality of electrical components of the circuit design, wherein at least one of the one or more new wire connections connects at least one additional electrical component of the circuit design to the existing interconnect network;
   defining a new interconnect network to include the plurality of existing wire connections and the one or more new wire connections;
   determining an adjustment technique that adjusts a width of at least one of the plurality of existing wire connections and the one or more new wire connections based on one or more predetermined requirements for the circuit design;
   in response to the adjustment technique comprising a decrease of width of the at least one of the plurality of existing wire connections and the one or more new wire connections, determining whether a user has allowed the decrease of width, such that the adjustment technique is not applied if the user has not allowed the decrease of width; and
   applying, by at least one processor, the adjustment technique to the new interconnect network before each of the at least one additional electrical component is connected to the existing interconnect network.

2. The method of claim 1, wherein the plurality of existing wire connections and the one or more new wire connections include at least one of: a plurality of wire segments and a plurality of vias.

3. The method of claim 2, wherein defining the new interconnect network and applying the adjustment technique are performed after each of the one or more new wire connections is added to the existing interconnect network, wherein the existing interconnect network is defined as the new interconnect network after each of the new wire connections is added.

4. The method of claim 3, wherein the addition of each of the one or more new wire connections is an editing action performed by a user with a software tool on the existing interconnect network that is at least partially displayed on a display screen.

5. The method of claim 2, further comprising:
   determining whether the adjustment technique is necessary before adjusting the width of the at least one of the plurality of existing wire connections and the one or more new wire connections.

6. The method of claim 5, wherein the adjustment technique includes adjustment of at least one of the plurality of vias connected to at least one of the plurality of wire segments if the adjustment technique is determined to be necessary.

7. The method of claim 1, wherein the at least one additional electrical component has never been connected to the interconnect network in the circuit design when the defining and applying are performed.

8. The method of claim 1, wherein applying the adjustment technique further comprises:
   determining a required configuration of the plurality of existing wire connections and the one or more new wire connections in the new interconnect network based on the one or more predetermined requirements for the circuit design;
   comparing the required configuration to a configuration of the new interconnect network to determine if the new interconnect network has one or more violations of the one or more predetermined requirements; and
   adjusting at least one of the plurality of existing wire connections and the one or more new wire connections if the one or more violations are found.

9. The method of claim 8, wherein the one or more predetermined requirements include minimum widths of the plurality of existing wire connections and the one or more new wire connections based on electrical currents intended to flow through the plurality of existing wire connections and the one or more new wire connections.

10. The method of claim 8, wherein the one or more predetermined requirements include a required number of vias based on electrical currents intended to flow through the plurality of existing wire connections and the one or more new wire connections.

11. The method of claim 1, further comprising:
    repeating the determining, defining, and applying until all additional electrical components are connected to the new interconnect network.

12. A computer program product comprising a non-transitory computer readable medium including program instructions implemented by a computer to provide a circuit design by performing a process comprising:
    determining that a user has added one or more new wire segments to an existing interconnect network comprising a plurality of existing wire segments;
    defining a new interconnect network to include the plurality of existing wire segments and the one or more new wire segments, wherein the defining is performed after each of the one or more new wire segments is added to the existing interconnect network;
    determining an adjustment technique that adjusts a width of at least one of the plurality of existing wire segments and the one or more new wire segments based on one or more predetermined requirements for the circuit design;
    in response to the adjustment technique comprising a decrease of width of the at least one of the plurality of existing wire segments and the one or more new wire segments, determining whether a user has allowed the decrease of width, such that the adjustment technique is not applied if the user has not allowed the decrease of width; and
    applying the adjustment technique to the new interconnect network after each of the one or more new wire segments is added to the existing interconnect network.

13. The computer program product of claim 12, further comprising:
    repeating the determining, defining, and applying until all of the one or more new wire segments are connected to the new interconnect network.

14. The computer program product of claim 13, further comprising:

determining whether the adjustment technique is necessary before adjusting the width of the at least one of the plurality of existing wire segments and the one or more new wire segments.

15. The computer program product of claim 13, wherein applying the adjustment technique comprises:
   determining a required configuration of the plurality of existing wire segments and the one or more new wire segments in the new interconnect network based on the one or more predetermined requirements for the circuit design;
   comparing the required configuration to a configuration of the new interconnect network to determine if the new interconnect network has one or more violations of the one or more predetermined requirements; and
   adjusting at least one of the plurality of existing wire segments and the one or more new wire segments if the one or more violations are found.

16. A system for providing a circuit design, the system comprising:
   a memory; and
   at least one processor in communication with the memory, wherein the memory, when executed by the processor, causes the processor to:
   cause a display of the circuit design on a display device connected to the processor;
   determine that one or more new wire connections have been added to an existing interconnect network comprising a plurality of existing wire connections that connect a plurality of electrical components of the circuit design, wherein at least one of the one or more new wire connections connects at least one additional electrical component of the circuit design to the existing interconnect network;
   define a new interconnect network to include the plurality of existing wire connections and the one or more new wire connections; and
   determine an adjustment technique that adjusts a width of at least one of the plurality of existing wire connections and the one or more new wire connections based on one or more predetermined requirements for the circuit design;
   in response to the adjustment technique comprising a decrease of width of the at least one of the plurality of existing wire connections and the one or more new wire connections, determine whether a user has allowed the decrease of width, such that the adjustment technique is not applied if the user has not allowed the decrease of width; and
   apply, by at least one processor, the adjustment technique to the new interconnect network before each of the at least one additional electrical component is connected to the existing interconnect network.

17. The system of claim 16, further causing the processor to:
   determine whether the adjustment technique is necessary before adjusting the width of the at least one of the plurality of existing wire connections and the one or more new wire connections.

18. The system of claim 16, wherein the processor applies the adjustment technique comprises causing the processor to:
   determine a required configuration of the plurality of existing wire connections and the one or more new wire connections in the new interconnect network based on the one or more predetermined requirements for the circuit design; and
   compare the required configuration to a configuration of the new interconnect network to determine if the new interconnect network has one or more violations of the one or more predetermined requirements; and
   adjust at least one of the plurality of existing wire connections and the one or more new wire connections if the one or more violations are found.

19. The system of claim 16, wherein the processor further repeats the determining, defining, and applying until all additional electrical components are connected to the new interconnect network.

\* \* \* \* \*